(12) United States Patent
Jibb et al.

(10) Patent No.: US 7,479,621 B2
(45) Date of Patent: Jan. 20, 2009

(54) MAGNETIC ANNEALING TOOL HEAT EXCHANGE SYSTEM AND PROCESSES

(75) Inventors: Richard John Jibb, Amherst, NY (US); John Fredric Billingham, Getzville, NY (US); Edward Duffy, Inchicore (IE); Noel O'Shaughnessy, Castleknock (IE); Kevin McMahon, Kilkee (IE); Peter Ferris, Celbridge (IE)

(73) Assignee: Praxair Technology, Inc., Danbury, CT (US)

( * ) Notice: Subject to any disclaimer, the term of this patent is extended or adjusted under 35 U.S.C. 154(b) by 180 days.

(21) Appl. No.: 11/294,477

(22) Filed: Dec. 6, 2005

(65) Prior Publication Data

US 2007/0125767 A1 Jun. 7, 2007
US 2008/0121634 A2 May 29, 2008

(51) Int. Cl.
*H05B 6/10* (2006.01)
*H01F 1/03* (2006.01)
*H01F 1/04* (2006.01)
(52) U.S. Cl. .......................... 219/632; 148/100; 148/112
(58) Field of Classification Search ................ 219/632, 219/618, 600, 677; 95/108, 103, 102, 509, 95/525, 565, 903
See application file for complete search history.

(56) References Cited

U.S. PATENT DOCUMENTS 3,666,869 A * 5/1972 Orecchia .................... 219/632
4,563,558 A * 1/1986 Rhemer et al. .............. 219/634
5,525,780 A * 6/1996 Moslehi ...................... 219/618
6,303,908 B1 10/2001 Yamaga et al. .............. 219/411
6,350,299 B1 * 2/2002 Dekker et al. ................. 95/268
6,588,453 B2 * 7/2003 Marty et al. ................. 137/801
6,693,264 B2 * 2/2004 Anderhuber et al. ........ 219/632
6,741,804 B2 5/2004 Mack et al. .................. 392/416
6,769,908 B2 8/2004 Kawase ........................ 432/77
7,122,770 B2 * 10/2006 Thomas et al. .............. 219/632
2004/0218913 A1 11/2004 Melgaard ..................... 392/418

FOREIGN PATENT DOCUMENTS

JP 2001007035 10/2000
JP 2001102314 4/2001

* cited by examiner

*Primary Examiner*—Daniel L Robinson
(74) *Attorney, Agent, or Firm*—Iurie A. Schwartz (57) ABSTRACT

A heat exchange system and processes for a magnetic annealing tool is provided. The system includes a process chamber housing workpieces to be processed; an element chamber partly surrounding the periphery of the process chamber, at least one vacuum for drawing a vacuum in fluid communication with the process chamber and separately with the element chamber in order to apply a vacuum to either or both of the process and element chamber so as to promote radiation heating of the workpieces; at least one supply of fluid in communication with the process chamber and separately with the element chamber to supply a cooling gas so as to promote conductive cooling of the workpieces; a cooling chamber disposed to surround the element chamber; and magnetic field generator for generating a magnetic field disposed on the outer periphery of the cooling chamber.

19 Claims, 6 Drawing Sheets

MAGNETIC ANNEALING TOOL HEAT EXCHANGE SYSTEM AND PROCESSES

BACKGROUND OF THE INVENTION

1. Field of the Invention

The present invention relates to a magnetic annealing tool heat exchange system which reduces the manufacturing cycle for the workpieces processed therein. The system provides an efficient heating and cooling cycle, as well as flexibility, as various components of the system can be independently controlled, depending on the process performed.

2. Description of Related Art

Magnetic annealing is one of three processes that are required to manufacture a Magneto Resistive Random Access Memory (MRAM) chip on a standard Complementary Metal Oxide Semiconductor (CMOS). To successfully anneal an MRAM wafer, the ferromagnetic layer must be held at a predetermined temperature in a magnetic field for a period of time long enough for the crystals to orient themselves in a common direction upon cooling. The process, which is also referred to as "soak" is carried out in an inert, reducing or vacuum environment to prevent oxidation of wafers, while they are held at the predetermined temperature.

Magnetic annealing tools generally operate batch-wise and perform a number of steps. They include heating, soaking and cooling steps which are carried out in a magnetic field, typically between 0.02 and 7.0 Tesla. The cost of MRAM chip manufacturing is linked to the magnetic annealing tools, where the productivity (acceptable devices produced per hour) is the product of density (number of devices per wafer), throughput (wafers per hour) and yield (ratio of acceptable devices to total number of devices processed) as dictated by the overall thermal/anneal cycle.

Several magnetic annealing systems have been proposed in the related art. Some of the systems either reduce the heating time or the cooling time associated with the magnetic annealing process. However, these process heating and cooling steps are in direct conflict with one another and, therefore deleteriously affect the annealing cycle. For example, U.S. Pat. No. 6,303,908 to Yamaga et al discloses a heat treatment apparatus which performs a heat treatment in a magnetic field. The apparatus has a heater which is arranged between a vacuum vessel and a magnetic field generator. The electric heater is arranged so as to surround the outer peripheral surface of the vacuum vessel, and a fluid cooling section is arranged between the electric heater and the magnetic field generator.

U.S. Pat. No. 6,741,804 B2 to Mack et al concerns the processing of electronic device, and methods for rapidly heating substrates. In particular, this patent document discloses a cylindrical lamp array structure surrounding a cylindrical process tube. The lamps are positioned with respect to the cylindrical process tube so that the sides of the lamps focus light energy in the direction of the lengthwise central axis. The substrates in the cylindrical process tube have a lengthwise central axis. The substrates are oriented within the cylindrical process tube so that the major surfaces of the substrates are substantially normal to the lengthwise central axis.

U.S. Pat. No. 6,769,908 B2 to Kawase relates to a wafer heat-treatment system, and more particularly to a lamp-heating single-wafer processing heat-treatment method that processes a single wafer by a film forming process. This patent document discloses an apparatus having a hollow space between the heaters and the wafer. During heating the hollow space is evacuated, thereby preventing heat transfer by conduction across the wafer chamber to the exterior. During cooling the hollow space is rapidly filled with gas, causing a drop in temperature and subsequent cooling.

U.S. Patent Application Publication No. 2004/0218913 A1 to Melgaard is directed to an annealing oven for magnetic and non-magnetic heat processing of work pieces, and to heat transfer techniques. The oven includes a shell into which a removable rack is placed. The rack has at least one plate which may be heated or cooled by a plate fluid conduit in contact with the plate and through which a heating or cooling fluid can be passed. The workpieces therein are primarily heated and cooled by conductive and radiant heat transfer.

Some of the disadvantages associated with the related art systems is that they are not sufficiently flexible to control and vary the heating and cooling steps independently and efficiently.

To overcome the disadvantages of the related art, it is an object of the present invention to shorten the thermal exchange cycle of the magnetic anneal tool by efficient heating and rapid cooling of the process chamber disposed in the magnetic anneal tool.

It is another object of the present invention to provide a separate and independent control of the process parameters affecting the process chamber of the magnetic anneal tool.

It is a further object of the invention to provide a system and process with independent control of the flow rate, temperature, pressure and composition of the gas supplied to the element chamber of the magnetic anneal tool.

Other objects and aspects of the present invention will become apparent to one of ordinary skill in the art on a review of the specification, the drawings and claims appended hereto.

SUMMARY OF THE INVENTION

The foregoing objectives are met by the system and process of the present invention. According to a first aspect of the invention, a heat exchange system for a magnetic annealing tool is provided. The system includes:

(a) a process chamber to house workpieces to be processed;

(b) an element chamber at least partially surrounding the workpieces, the element chamber including one or more electrical resistance heating elements;

(c) means for drawing a vacuum in fluid communication with the element chamber in order to apply a vacuum to the element chamber so as to decrease gas conduction within the element chamber;

(d) one or more gas sources in fluid communication with the element chamber to increase gas conduction within the element chamber;

(e) a cooling chamber disposed to at least partially surround the element chamber; and (f) means for generating a magnetic field disposed on the outer periphery of the cooling chamber.

According to another aspect of the invention, a process of annealing a predetermined number of wafers in a magnetic annealing tool is provided. The process includes:

(a) loading the workpieces into a process chamber of the magnetic annealing tool;

(b) sealing the process chamber and separately sealing an element chamber at least partially surrounding the periphery of the process chamber and optionally pulling a vacuum from one or both chambers;

(c) energizing one or more arrays of electrical resistance heating elements before, during or following step (b) to rapidly heat the workpieces from ambient temperature to the annealing temperature;

(d) maintaining the annealing temperature for a predetermined period of time;

(e) raising the pressure in the element chamber to a soft or rough vacuum upon the expiration of the predetermined period of time in step (d) so as to facilitate cooling of the workpieces by heat transfer to the cooling fluid; and (f) re-pressurizing the process chamber and unloading the workpieces from the process chamber.

BRIEF DESCRIPTION OF THE DRAWINGS

The objects and advantages of the invention will become apparent from the following detailed description of the preferred embodiments thereof in connection with the accompanying drawings, in which like numerals denote same features, and in which:

FIGS. 4 A-C depict sixteen separate thermal/anneal processes/recipes carried out with the heat exchange system of the present invention.

DETAILED DESCRIPTION OF THE INVENTION AND EXEMPLARY EMBODIMENTS

The magnetic annealing process is essentially a thermal cycle carried out in a magnetic field. The heating and cooling steps comprise about fifty percent (50%) or more of the total cycle time. The present invention provides a heat exchange system which reduces the cycle time associated with both the heating and cooling of workpieces as it allows the flow, temperature, pressure and composition of the gas provided to the element chamber (described herein) to be controlled separately from the conditions within either the process chamber, or the cooling chamber of a magnetic annealing tool. For example, by pulling a hard vacuum in the element chamber, heat transfer by gas conduction is reduced to a low level, such that the total rate of heat flow to the coolant may be reduced by 70-95%. In other words, by controlling the pressure flow and composition of gas in the element chamber it is possible to control the rate of heat transfer to the cooling chamber. This provides a thermal switching mechanism in the element chamber that enables switching between cooling primarily through gas conduction and heating primarily through radiation and, thereby allows for the design to be implemented for both heating and cooling.

Figure 1:
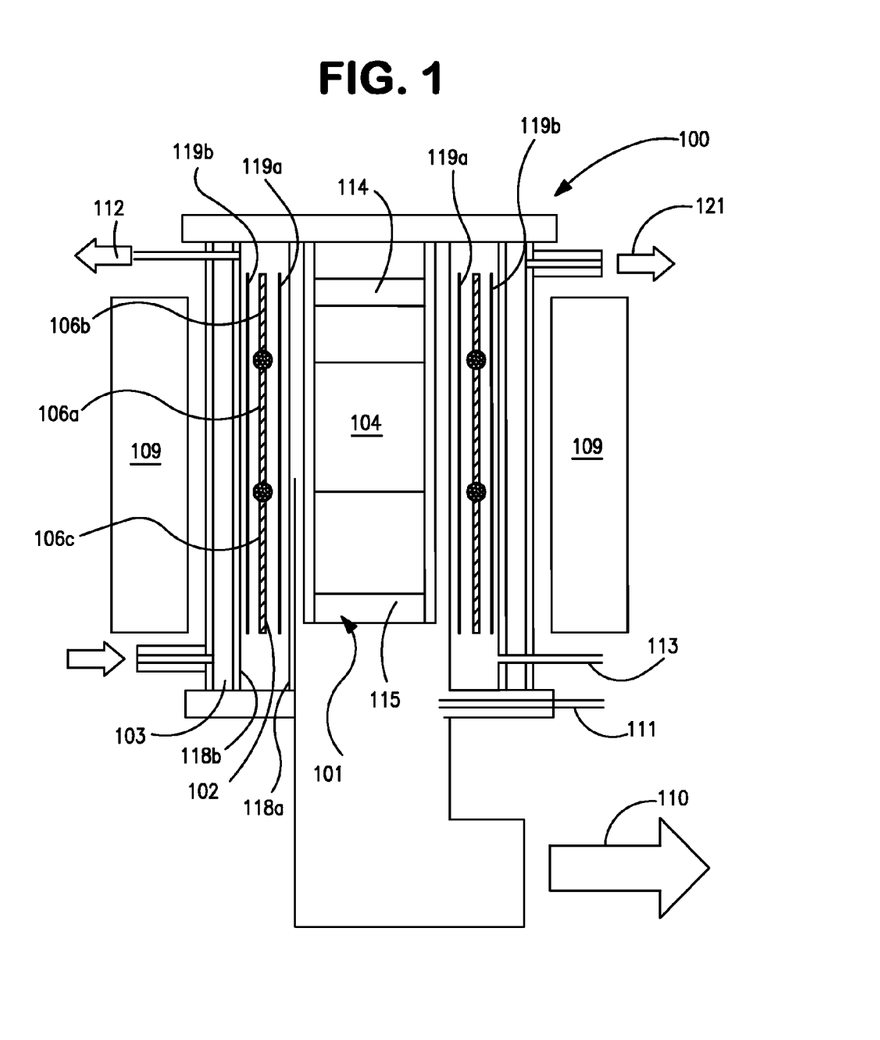
FIG. 1 is a schematic diagram of a heat exchange system for a magnetic annealing tool.

With reference to FIG. 1, a heat exchange system for a magnetic anneal tool 100, is illustrated. A process chamber 101 is disposed in anneal tool 100 to receive and hold a number of workpieces 104 during the thermal/anneal cycle. It will be understood by those skilled in the art that the workpieces can be wafers, MRAM chips, giant magneto resistance heads, hard disc drives and any other devices which may be annealed in a magnetic field. Work pieces may include, for example, semiconductor wafers used in the manufacture of MRAM devices, wafers used in the manufacture of Magnetic Tunnel Junction devices, Giant Magneto Resistance (GMR) sensors, magnetization of metallic objects at elevated temperatures, degaussing of magnetic thin films, and other objects that require annealing under the influence of magnetic fields. The workpieces are held on a rack or similar device. If the workpieces are semiconductor wafers, they will preferably be placed at a variable pitch of about 3 mm to 10 mm, when wafers are processed, in order to effectively perform the thermal cycle. Process chamber 101, is connected to means for pulling or drawing a hard vacuum therein. The means include a high or hard vacuum pump, and/or roughing pump which is capable of drawing a vacuum in the range of $10^{-7}$ to 10 Torr. In an exemplary embodiment, the roughing pump is utilized in series with a high or hard vacuum pump. The roughing pump is employed to draw a vacuum to around $10^{-3}$, while the high or hard vacuum pump is subsequently employed to further draw the vacuum to $10^{-7}$ Torr. The roughing pump can be selected from among an oil sealed pump or dry pump, while the high or hard vacuum pump can be selected from among, turbo pumps, diffusion pumps, cryopumps or any other device capable of drawing the requisite vacuum.

At least partially surrounding process chamber 101 is an element chamber 102 having a number of heating assembly zones (106a-106c) therein, which can be independently monitored and controlled. In a particular embodiment, the element chamber 102 can be sealed within the chamber walls 118a and 118b of process chamber 101. Element chamber 102, although sealed, is nonetheless fluidly connected to a means for drawing a hard vacuum into the element chamber. The means can include the ones described above with respect to process chamber 101. Separately, a gas can be introduced into the element chamber. On the outer periphery of wall 118a cooling chamber/jacket 103 is disposed to provide the removal of the heat from the process chamber upon completing any one of the heating steps carried out in the anneal cycle/process.

A means for generating a magnetic field 109 is disposed on the outer periphery of cooling chamber 103 to obtain a magnetic field ranging from about 0.02 to 7.0 Tesla. These means include permanent, superconducting or horizontal superconducting magnets and electromagnets.

In an exemplary embodiment, and referring back to FIG. 1, element chamber 102 is connected to a pump, such as a turbo pump (not shown), which is capable of drawing or pulling a hard vacuum through line 112, that is to a pressure sufficiently low to effectively reduce gas conduction, i.e. the thermal conductivity of the intervening gas medium and thereby reduce conduction from the heat elements to the inner wall of the cooling chamber. The reduction in thermal conductivity coincides with the pressure at which the gas molecules begin to collide more frequently with the various walls of the element chamber than with each other. Although not wanting to be bound by any particular theory, it is believed that as the pressure is lowered, the interparticle collisions become less frequent and the thermal conductivity is reduced. The pressure at which a reduction in thermal conductivity of the gas medium is observed is not a constant value, rather it is a function of the mean free path of the gas molecule relative to the average distance between the various surfaces in the element chamber 102. The mean free path of the molecule is temperature dependant. An exemplary pressure level which is suitable in the element chamber to reduce gas conduction during heating would be on the order of $10^{-4}$ Torr. The element chamber is also fluidly connected to a supply of cooling gas via line 113. When cooling gas is supplied to the element chamber, the pressure in the element chamber increases such that gas conduction heat transfer, and to some extent convective heat transfer, are increased. The rate of heat transfer to the cooling chamber is increased by about 3-20 times over the heat transfer rate when the element chamber is held in hard vacuum.

In a further exemplary embodiment, the drawing of the vacuum and the withdrawal of cooling gas can be accomplished via a single line. The gas supplied can be selected from among helium, nitrogen, argon, compressed dry air and a mixture thereof. Preferably, the cooling gas is helium because of its relatively high thermal conductivity and specific heat capacity. The pressure, flow and composition of the gas in the element chamber may each be varied independently of the process chamber. The cooling rate is independent of gas flow in a range of about 1-100 slpm, and a gas pressure of 1-1000 Torr. The composition is varied by utilizing one or more gas sources in fluid communication with the element chamber, via a manifold to introduce said gases into either the element chamber or the process chamber.

A suitable means for controlling the pressure (vacuum level) in the element chamber and separately in the process chamber is by way of upstream pressure control using various gas flow (loads) or by way of downstream pressure control using a throttle valve on the vacuum foreline to vary the effective pumping speed being delivered to the chamber. A typical pressure control system will include a pressure sensor, a PID controller and a control element such as a flow control valve. Upstream pressure control can be achieved by way of a gas flow capacitance manometer such as a BARATRON™ or a mass flow meter used to measure the gas inlet flow or the chamber pressure. The signal from the measuring device is fed to a PID controller, which compares the measure pressure or flow to the desired set point, and adjusts the gas flow control valve, accordingly. Downstream pressure control is achieved using a throttle valve on the vacuum foreline to vary the effective pumping speed being delivered to the chamber. For pressure control with multiple gas sources, multiple mass flow controllers are slaved to a master PID controller which regulates either pressure or flow. The master PID controller adjusts the total flow to achieve the desired pressure, while the mass flow controller adjusts the flow of each individual gas to obtain the desired mixture or to select between the gas sources.

Hence, it is possible to supply a gas to the element chamber 102 at a pressure corresponding to rough or soft vacuum, while process chamber 101 is maintained in a hard vacuum condition. Conversely, it is possible to hold a hard vacuum in element chamber 102, while a gas such as helium is introduced into process chamber 101 at a pressure corresponding to rough or soft vacuum.

More particularly, process chamber 101 is independently controlled from element chamber 102. Process chamber 101 is connected to a vacuum pump, such as a turbo pump, via line 110. A vacuum is drawn or pulled on the process chamber during a particular process step of the thermal/anneal cycle and a gas may be introduced via line 111. As with element chamber 102, it is contemplated that the drawing of vacuum and withdrawal of gas may be accomplished via a single line.

The cooling chamber or jacket disposed between the element chamber 102 and magnet means 109, is provided with cooling fluid 121 circulated through the chamber at a flow of about 5-10 liters per minute, and at a temperature of around 20° C. The cooling chamber is configured for maximum heat transfer efficiency when the element chamber or both the element chamber and the process chamber are running in conduction mode (i.e., during the cooling phase of the thermal/anneal cycle), and prevents the overheating of magnet means 109 by maintaining the exterior temperature below 35° C. The cooling fluid employed in the cooling chamber includes, but is not limited to water, a 50/50 solution of water and ethylene glycol, or any fluid that provides the requisite cooling temperature. In the event ethylene glycol is used, a lower cooling temperature than 20° C. can be obtained. Forced air cooling could also be used. In this case, a separate insulating layer is required between the outer wall of the cooling chamber and magnetic field generator.

In another exemplary embodiment of the invention, and with continued reference to FIG. 1, process chamber 101 includes top heat shield 114 and bottom heat shield 115, above and below the workpiece stack, respectively. Preferably, in the annealing process the workpieces are disposed in the center of the process chamber, roughly equidistant from the top and bottom of the process chamber. The heat shields prevent axial heat transfer between the workpiece stack and the top and bottom of the process chamber. These shields should be non-magnetic and, preferably have a heat reflective surface with emissivity of 0.5 or less. Particularly, the heat shields are conducive to the removal of heat from the workpieces in a primarily radial direction. Radial heat transfer is preferred as it promotes uniform cooling of the stack. Heat transfer between successive workpieces in a stack, on the other hand, is much less efficient than conduction along a single workpiece. For example, when heat is removed axially from the top and bottom of the stack the cooling is non-uniform since each workpiece is separated by space filled with either a vacuum or gas. These mediums provide a resistance to heat flow from the central workpiece relative to the top and bottom workpieces such that the top workpiece cools at a faster rate than the central workpiece.

Uniform heating of the workpieces, can be accomplished by independently providing energy and control of the various heater elements in the element chamber. In a particular embodiment, the heater elements are divided axially into three different zones (106a-106c), wherein the center zone heater 106(b) is lined up with the workpiece stack. Two end zone heaters 106(a) and 106(c) are provided above and below the center heater, respectively, and are independently controlled. In another configuration, the heaters can be divided radially into separate zones, for instance three heaters each covering 120 degrees. The power input to each heated zone can be varied separately to achieve uniform heating. Generally, the thermal mass of the heater elements, heat flux plates and inner wall 118(a) should be minimized to reduce the power input for a given temperature rise, and heat removal for a given temperature drop. In other words, it is desirable for the workpieces to be the largest thermal mass in the system. In this manner, the possibility of temperature non-uniformity is greatly reduced. Likewise, the gap between 118(a) and 118(b) is kept at a minimum, as this will serve to minimize the bore necessary for the magnetic means, and will maximize the conductive heat transfer between the process chamber, the heater elements, and the inner wall of the cooling chamber while in conduction mode. Preferably, the heater elements are selected from an array of electrical resistance heaters sufficient to provide and maintain an annealing temperature. As utilized herein, annealing temperatures range from about 200-1000° C., depending on the device manufactured. The heater elements are wound so as to cancel out forces generated by the strong magnetic field in which they are disposed.

Process chamber 101, includes wall 118a which separates the workpieces worked upon from element chamber 102. The material employed for the chamber wall can be any type of material suitable for use in a semiconductor fab. Preferred materials are those with either high emissivity, high thermal conductivity, or low heat capacity, or a combination thereof. Typically, the wall is manufactured from transparent 214 fused silica glass (i.e., quartz), which is partially transparent to wavelengths in an electromagnetic spectrum of 0.78 and 1000 µm (e.g., infra red) or silicon carbide which has high emissivity and thermal conductivity. When manufacturing silicon wafers in a temperature range of 100 to 400° C., for example, the transmissivity of the quartz wall or tube ranges from 5 to 12 percent. In accordance with Kirchoff's law, the emissivity of the quartz is in the range of 88 to 95 percent. The chamber wall can also be a stainless steel material. Although stainless steel has a lower emissivity than quartz or silicon carbide, it can be made thinner thereby reducing its total heat capacity, in addition to reducing the bore of the magnet. Further, stainless steel can be welded or sealed in other ways that are not possible with quartz or silicon carbide.

Chamber wall 118a surrounds the workpieces and forms a barrier between process chamber 101 and element chamber 102. The chamber wall 118a can be in the form of a quartz tube which is sealed at both ends by means of a demountable gasket seals using O-rings at the top and bottom of the chamber, thereby forming separate process and element chambers. Additionally, the quartz tube serves to prevent contamination of the process chamber and facilitates ease of cleaning.

Figure 2:
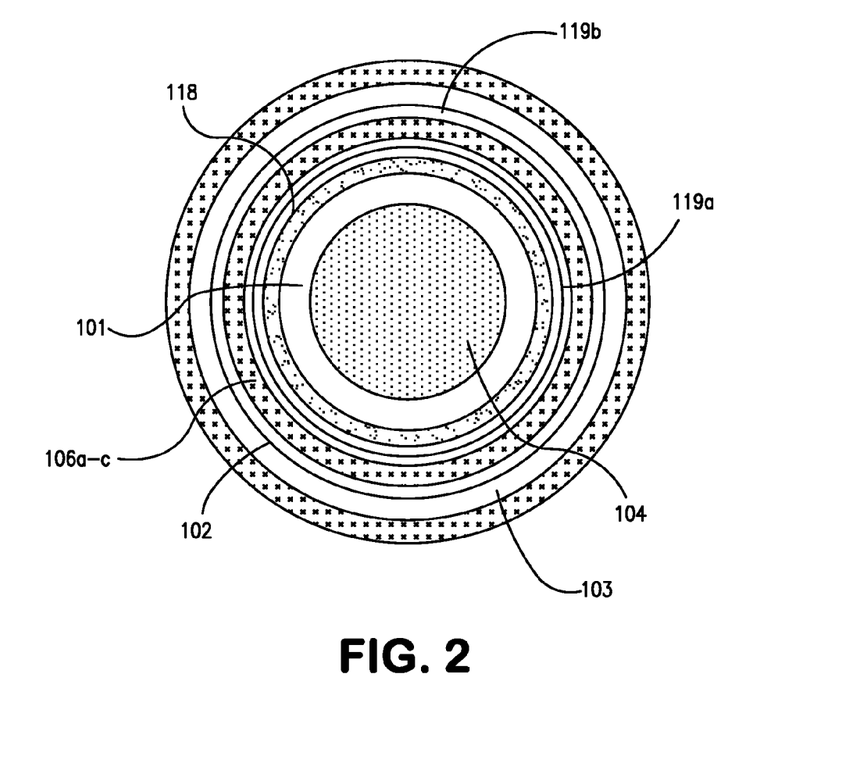
FIG. 2 is a top cross-sectional perspective view of the heat exchange system.

Heater elements 106(a-c) can be supported in any number of ways. For example, the element chamber may be positioned between heat flux plates or can be supported directly by the wall of the process chamber. As defined herein, heat flux plates refers to plates that modify the heat flux emanated from the heater elements to either promote or inhibit radiant heat exchange between the heaters and process chamber and the cooling chamber, respectively. With reference to FIG. 2, the element chamber includes heat flux plates 119(a) and 119(b) and plate 119(a) facing process chamber 101 and in turn the workpieces disposed therein, has a higher emissivity than heater flux plate 119(b) facing cooling chamber 103. Heat flux plate 119(b) prevents the excessive heating of the cooling fluid circulating through cooling chamber 103, while heat flux plate 119(a) enhances uniform radiant heating of the workpieces disposed in the process chamber. It will be understood that the heat flux plates may be manufactured from stainless steel or any other materials that would impart the emissivity characteristics necessary for the thermal cycle.

Heat flux plate 119(b) can further be polished so as to provide a shiny and reflective surface, facing the cooling chamber. On the other hand, heater support 119(a) facing the process chamber should not have a reflective surface, so as to promote radiative heat exchange between itself and the wall of the process chamber during the heating cycle. Typically, heat flux plate 119(a) is a polished stainless steel material having an emissivity in the range of about 0.07-0.17, while 119(b) is a stainless steel material having an emissivity ranging from about 0.3-0.6. The inner wall of the cooling chamber 103, is preferably polished as well, to inhibit radiative heat transfer between itself and the heat flux plate 119(b) during the heating step of the thermal cycle. The result of either or both of the measures described above is that, for a given power input to the heaters, in a radiation mode, the fraction of the supplied energy being transferred to the cooling jacket is reduced, and the fraction being transferred to the workpieces is increased.

In a further embodiment, the heating elements are disposed in a free standing structure, which is positioned to surround the process chamber 101. In this instance, and with reference to FIG. 2, the heating elements would be sealed in a stainless steel assembly with heater supports/walls 119(a) and 119(b), which can be evacuated or purged with gas independent of process chamber 101. The atmosphere of process chamber 101 would be in contact with the inner wall of cooling chamber 103.

The heater supports, can be modified in a number of ways to achieve the objects of this invention. In one embodiment, the emissivity of the inner facing heater support 119(a) is raised relative to outside facing heater support 119(b). In another embodiment, the inside surface 220 of cooling chamber 103, can be polished to provide a lower emissivity. Alternatively, in yet another embodiment a sheet of polished stainless steel or the like, having a cylindrical configuration can be disposed between the heater support 119(b) and the inside surface 220 of cooling chamber 103. In a further exemplary embodiment multiple sheets of a reflective material such as polished aluminum can be employed between the heater support 119(b) and the inside surface 220 of cooling chamber 103. Other exemplary embodiments are envisioned where heat flux plate 119(a) is omitted, and the element chamber 102 or the heaters 106 (a)-(c) are positioned in contact with the process chamber wall; heat flux pate 119(b) is a free standing heat shield which is not combined with the supports of the element chamber 102; the heat flux plate 119(b) can consist of multilayer insulation; and inner polished surface of cooling chamber 103 is replaced with heat flux plate 119(b).

The invention is also directed to methods for magnetic and non-magnetic annealing of workpieces. An exemplary embodiment of the process of the invention involves carrying out the annealing of workpieces, such as wafers, at a certain temperature so as to orient the crystals in a certain direction. Workpieces 110 are placed onto a rack in process chamber 101, under a certain environment, and a hard vacuum in element chamber 102 is drawn such that gas conduction mode of heat transfer is reduced. Generally, the pressure in the element chamber is at between $10^{-4}$ and $10^{-2}$ Torr. The workpieces are held at a predetermined temperature, while a magnetic field is applied via means 109. This latter step is also referred to as a soaking step. A flow of cooling fluid is introduced into the element chamber, such that the absolute pressure is raised to a soft vacuum. The flow of gas into element chamber 102 is initiated to achieve the desired cooling effect (i.e., heat transfer from the workpieces, via the element chamber to the cooling fluid). Cooling of element chamber 102 in turn allows the workpieces to attain a temperature low enough such that they can be removed. Some of the process conditions associated with the magnetic tool call for heating at 300° C. for about forty five minutes, soaking for two hours at 300° C., and cooling down to 100° C. over about seventy minutes.

During the heating step, element chamber 102 performs as a "vacuum insulator". This heat shielding effect is promoted by providing a heat flux plate 119(a) having a higher emissivity than heat flux plate 119(b) facing the cooling chamber 103. In the cooling phase/step, the pressure in element chamber 102 is raised by introducing a flow of cooling gas, such as helium. Upon raising the pressure the vacuum insulating effect is lost, because the gas thermal conductivity is raised such that convective and conductive heat transfer between the inner wall 118a of process chamber 101 and inner wall of cooling chamber 103 becomes significant. Hence, the rate of energy transfer from the workpieces through process chamber wall 118a to the fluid in the cooling chamber 103 is high. In this manner the heat transfer to cooling chamber 103 is minimized during heating but maximized during cooldown.

Figure 3:
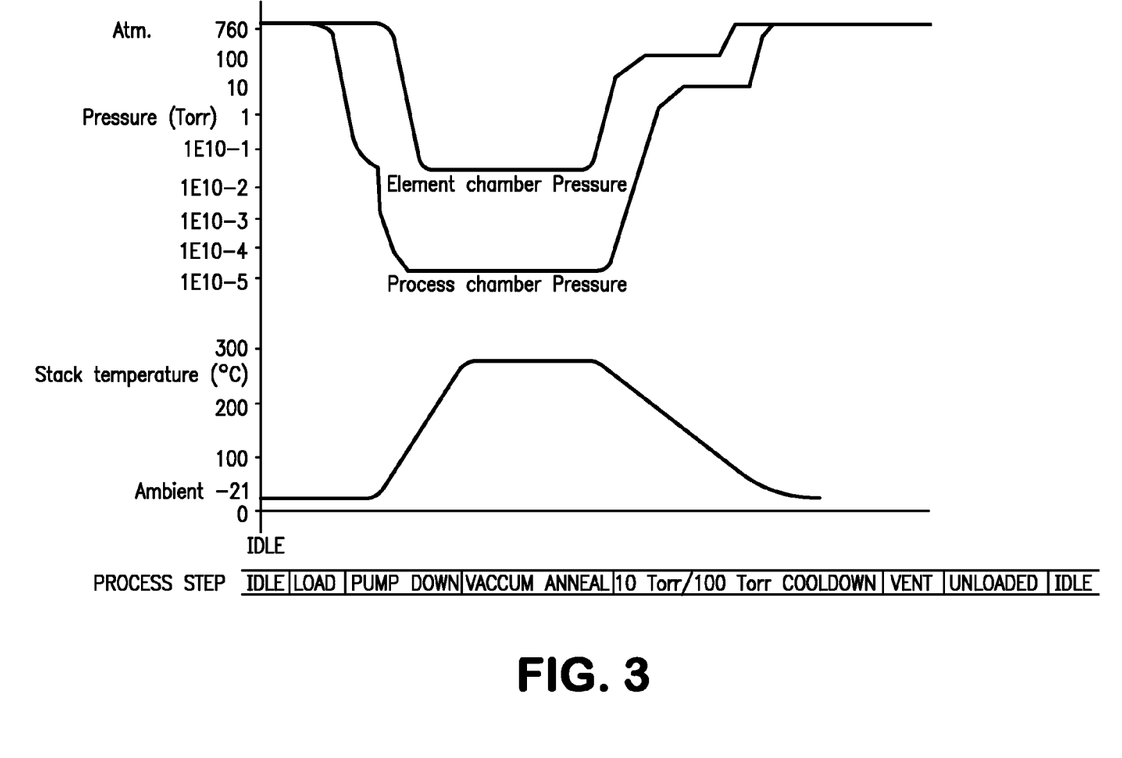
FIG. 3 depicts the thermal/anneal process and the process temperature and pressure profile in the sequence.

In another exemplary embodiment, which minimizes the thermal cycle, and with reference to FIG. 3, a number of wafers 104 are removed from wafers cassettes via a robotic arm and placed in process chamber 101. The process chamber 101 and element chamber 102 are sealed, and the atmosphere therein is pumped down (i.e., a vacuum is drawn). The process chamber can be pumped to a hard vacuum ranging from about $10^{-7}$ to about $10^{-2}$ Torr, a rough vacuum of about $10^{-3}$ to 10 Torr or a soft vacuum from about 10 Torr to 760 Torr depending on the requirements for the workpiece processed.

Element chamber 103 is pumped to a vacuum below $10^{-1}$ Torr and preferably below $10^{-2}$ Torr. This pressure will be low enough that gas conduction is decreased. Thereafter, the wafers are heated rapidly from ambient temperature to the desired anneal temperature by the array of resistance heaters 106(*a*)-106(*c*).

Wafers 104 are then soaked by maintaining the anneal temperature in a range from about 150 to 500° C. for a period of roughly two hours. Once the soak step is completed, the power to the heaters is cut, and the pressure in the element chamber 102 is raised by flowing gas therethrough. Process chamber 101, on the other hand, may be held at vacuum, in an inert or reducing atmosphere, or purged with a flow of inert or reducing gas, depending on the specific nature of the anneal process. The wafers are then cooled to a temperature low enough to be removed from the process chamber. On attaining this temperature, the process chamber is re-pressurized and the wafers are removed.

The various processes of the present invention will be further described in detail with reference to the following examples, which are, however, not to be construed as limiting the invention.

EXAMPLES

The particular processes described herein involve utilization of the system of the present invention, wherein an inert or reducing (i.e., non-oxidizing) atmosphere may be introduced to the process chamber at any stage in the anneal cycle/process. For instance, the heating and soaking steps may be carried out in a hard vacuum, while the cooling steps, may be carried out in a soft vacuum, a rough vacuum or a positive pressure (i.e., above 760 Torr) by introducing an inert or reducing atmosphere. The process conditions vary depending on the annealing cycle/process. Temperatures in the process chamber range from 200 to 1000° C., and the pressure will range from a hard vacuum (e.g., $10^{-7}$ Torr) to atmospheric conditions (e.g., 760 Torr). The workpieces can be processed in an inert atmosphere, a reducing atmosphere, or a vacuum. The gases employed can be hydrogen, helium, nitrogen, argon or any mixtures therefrom. The gases include in the cooling step (i.e., introduced into the element chamber) include compressed gases and mixtures thereof.

Figure 4A:
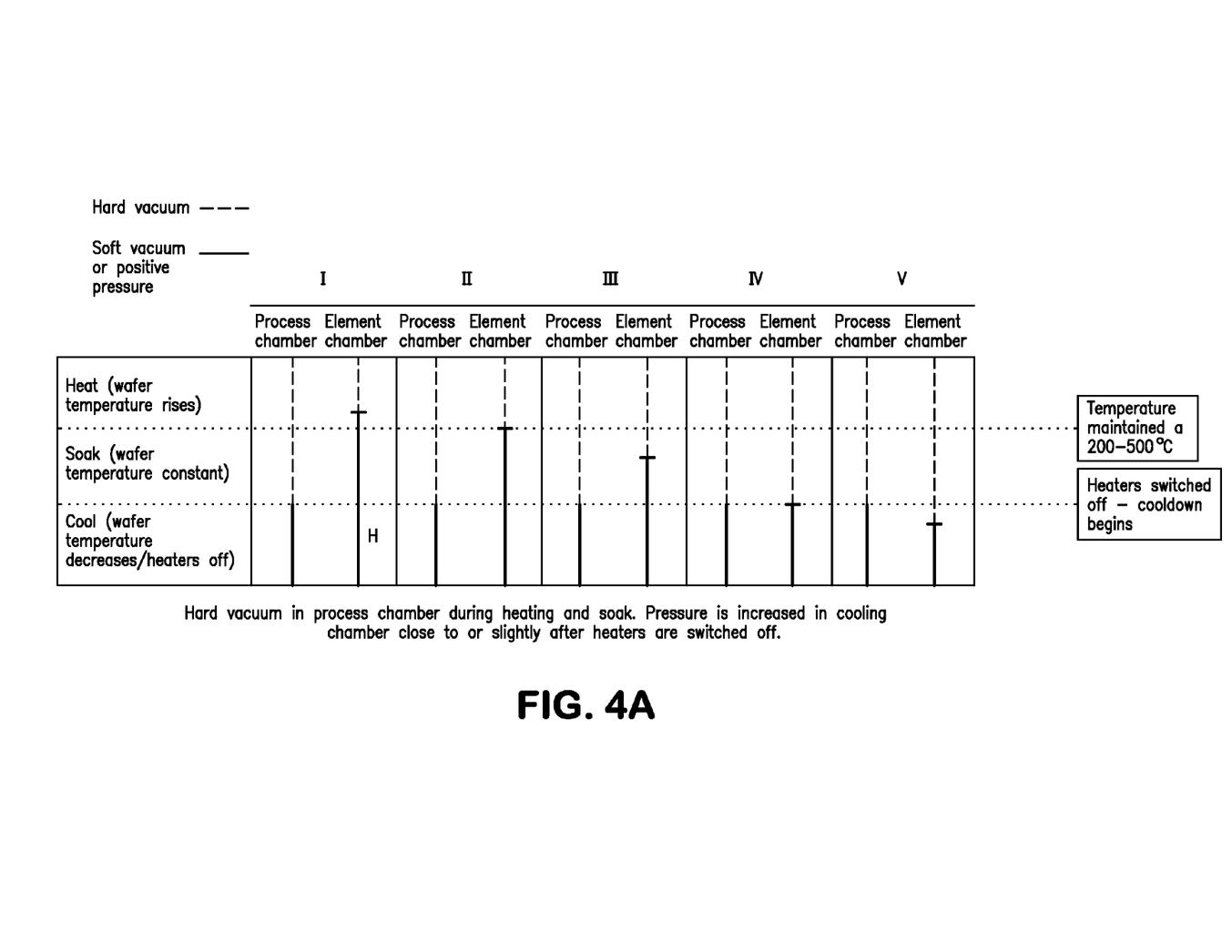
Figure 4B:
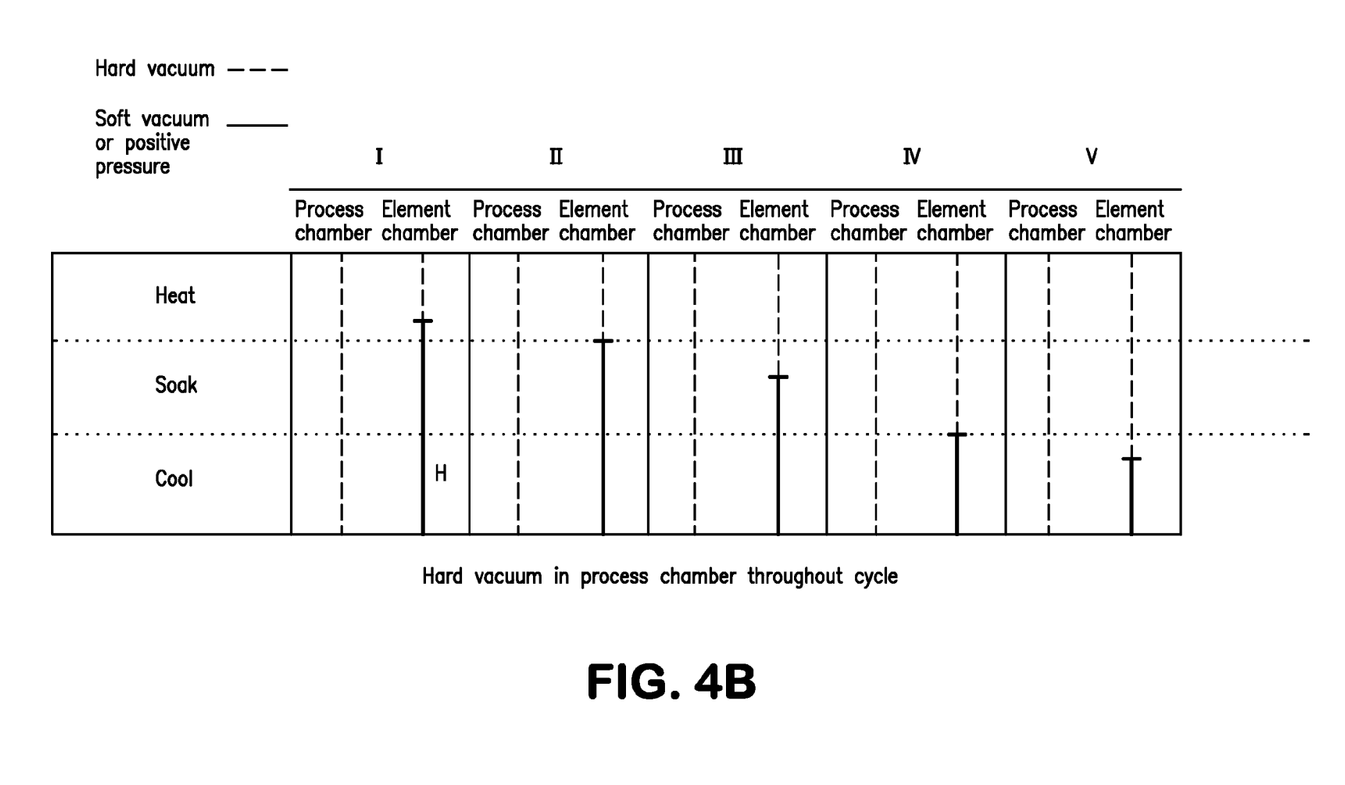
Figure 4C:
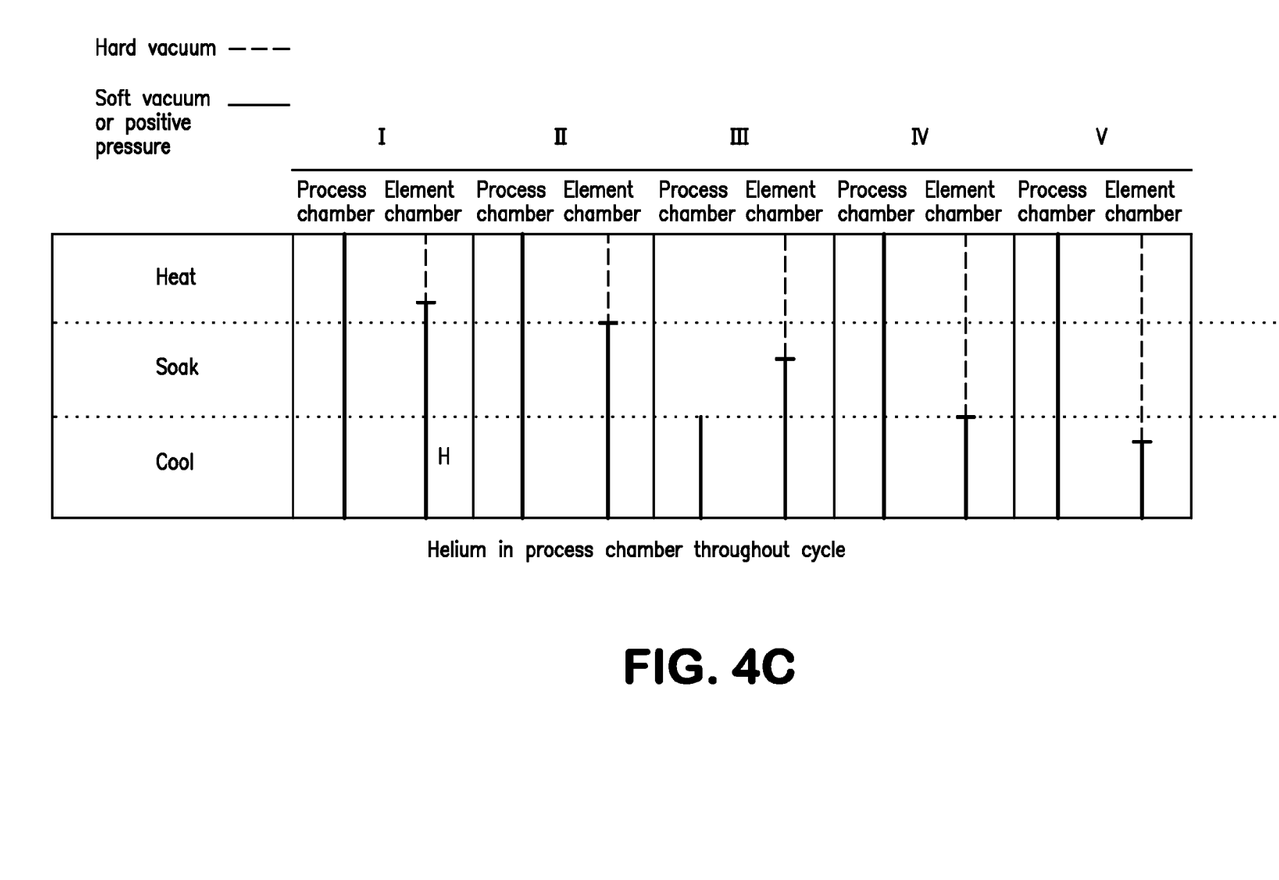

With reference to FIG. 4, fifteen process cycles/recipes are depicted. In all the processes, the wafers are loaded into the process chamber, and sealed therein. As shown in FIG. 4A, five process cycles are shown. A hard vacuum is pulled on the process chamber during the heating and soaking steps, and a soft vacuum or positive pressure is introduced during the cooling step. On the other hand, the element chamber is independently controlled, following a predetermined period of time, which is dependent on the workpiece annealed, a helium gas is utilized to raise the pressure in the element chamber from hard vacuum to soft vacuum, rough vacuum, or positive pressure, and thereby facilitate heat transfer between the wafers and the cooling fluid. Upon review of the FIG. 4A, it is noted that the helium gas may be introduced (a) prior to the soaking step; (b) as the soaking step commences; (c) during the soaking step; (d) as the cooling step commences; and during the cooling step.

With reference to FIG. 4B, a hard vacuum is pulled in the process chamber throughout each one of the five cycles. In these process cycles, helium is introduced into the element chamber during (a) prior to the soaking step; (b) as the soaking step commences; (c) during the soaking step; (d) as the cooling step commences; and during the cooling step.

In a third process cycle, a soft vacuum or positive pressure gas is introduced into the process chamber, and separately a hard vacuum is pulled in the element chamber. Thereafter, and as shown in FIG. 4C a soft vacuum or positive pressure helium is introduced into the element chamber during (a) prior to the soaking step; (b) as the soaking step commences; (c) during the soaking step; (d) as the cooling step commences; and during the cooling step.

Upon completion of any one of the aforementioned processes, the process chamber is re-pressurized and the wafers are unloaded.

Through the implementation of the above-described processes in the system of the present invention the overall cycle is reduced by 10 to 30 percent.

While the invention has been described in detail with reference to specific embodiments thereof, it will be apparent to one skilled in the art that various changes and modifications can be made, and equivalents employed, without departing from the scope of the appended claims.

We claim:

1. A process of annealing a predetermined number of workpieces in a magnetic annealing tool, comprising:
   (a) loading the workpieces into a process chamber of the magnetic annealing tool;
   (b) sealing the process chamber and separately sealing an element chamber partly surrounding the periphery of the process chamber and optionally pulling a vacuum from one or both chambers;
   (c) energizing one or more arrays of electrical resistance heating elements disposed in the element chamber before, during or following step (b) to rapidly heat the workpieces from ambient temperature to the annealing temperature;
   (d) maintaining the annealing temperature for a predetermined period of time;
   (e) raising the pressure in the element chamber to a soft or rough vacuum upon the expiration of the predetermined period of time in step (d) so as to facilitate cooling of workpieces by heat transfer to a cooling fluid; and
   (f) re-pressurizing the process chamber and unloading the workpieces from the process chamber.

2. The process of annealing in accordance with claim 1, wherein the vacuum pulled in the process chamber ranges from about $10^{-7}$ Torr to 20 Torr.

3. The process of annealing in accordance with claim 1, wherein the vacuum pulled in the element chamber ranges from about 750 Torr to $10^{-5}$ Torr.

4. The process of annealing in accordance with claim 1, further comprising: introducing a gas into the element chamber to raise the pressure into the soft vacuum range.

5. The process of annealing in accordance with claim 1, wherein the vacuum pulled on the process chamber and the element chamber is independent of one another.

6. The process of annealing in accordance with claim 1, wherein the element chamber includes a first heat shield facing the process chamber and a second heat shield facing a cooling chamber which is disposed to surround the element chamber, and wherein the first heat shield has a higher emissivity than the second.

7. The process of annealing in accordance with claim 1, wherein the gas is selected from the group consisting of hydrogen, helium, nitrogen, argon, compressed dry air and mixtures thereof.

8. The process of annealing in accordance with claim 1, further comprising: introducing a gas into the process chamber prior to step (c), pulling a hard vacuum on the element chamber during steps (c) and (d), and introducing a gas into the element chamber during step (e).

9. The process of annealing in accordance with claim 1, further comprising: introducing a gas into the process chamber prior to step (c), pulling a hard vacuum in the element chamber during step (c) and introducing a gas into the element chamber during steps (d) and (e).

10. The process of annealing in accordance with claim 1, further comprising: introducing a gas into the process chamber prior to step (c) and into the element chamber during steps (c)-(e).

11. The process of annealing in accordance with claim 3, wherein the pressure, flow, and composition of gas are varied independently for each chamber.

12. The process of annealing in accordance with claim 1, further comprising: pulling a hard vacuum on the process chamber, and introducing a gas in the element chamber during steps (c)-(e).

13. The process of annealing in accordance with claim 12, where the gas introduced to both the element chamber and the process chamber is helium.

14. The process of annealing in accordance with claim 1, further comprising: pulling a hard vacuum on the process chamber and the element chamber during steps (c)-(e).

15. The process of annealing in accordance with claim 1, further comprising: pulling a hard vacuum in the process chamber, separately pulling a vacuum on the element chamber during step (c) and introducing a gas into the element chamber during steps (d) and (e).

16. The process of claim 14, wherein the flow rate, pressure and composition of the gas into the process chamber and the element chamber is separately controlled and adjusted for each chamber.

17. The process of claim 1, further comprising: routing cooling fluid through a cooling chamber during steps (a)-(f), wherein a cooling chamber is disposed to surround the element chamber.

18. The process of claim 17, wherein the cooling fluid is routed at a fluid flow rate of about 5-10 lpm and a temperature of about 20° C.

19. The process of claim 18, further comprising: maintaining the temperature of the magnets in the magnetic annealing tool below 45° C.

* * * * *